United States Patent

Tongbhoyai et al.

[11] Patent Number: 6,043,489
[45] Date of Patent: Mar. 28, 2000

[54] POSITRON SOURCE

[75] Inventors: Martin Tongbhoyai, Berlin; Karl Maier; Holger Greif, both of Bonn, all of Germany

[73] Assignee: LEO Elektronenmikroskopie GmbH, Germany

[21] Appl. No.: 08/985,397

[22] Filed: Dec. 5, 1997

[30] Foreign Application Priority Data

Dec. 6, 1996 [DE] Germany .......................... 196 50 694

[51] Int. Cl.[7] .................................................. H01J 37/08
[52] U.S. Cl. .......................... 250/308; 250/307; 250/309
[58] Field of Search ................................... 250/308, 309, 250/307

[56] References Cited

U.S. PATENT DOCUMENTS 4,740,694  4/1988  Nishimura et al. ..................... 250/307

FOREIGN PATENT DOCUMENTS 0 205 092 B1  2/1992  European Pat. Off. ......... H01J 37/30

OTHER PUBLICATIONS

Canter et al., "Measurement of total cross sections for low energy positron–helium collisions", Journal of Physics B: Atomic. Molec. Physics., vol. 5, pp. L167–L169, Aug. 1972.

Primary Examiner—Jack Berman

[57] ABSTRACT

A positron source with high intensity and low energy bandwidth and small spatial dimensions, has a positron emitter of high specific activity and, following the positron emitter, a reflection moderator with a hole. The hole diameter on the emitter side of the reflection moderator is smaller than 0.4 mm, preferably below 0.1 mm. Because of the small hole diameter and the small energy spread, the phase space of the positrons coming from the positron source corresponds to the phase space of the electrons emitted by a conventional thermionic cathode. The positron source can therefore be used in a conventional scanning electron microscope, which can be selectively changed over between positron operation and electron operation. Two adjusting units and are provided for adjustment of the positron source.

22 Claims, 3 Drawing Sheets

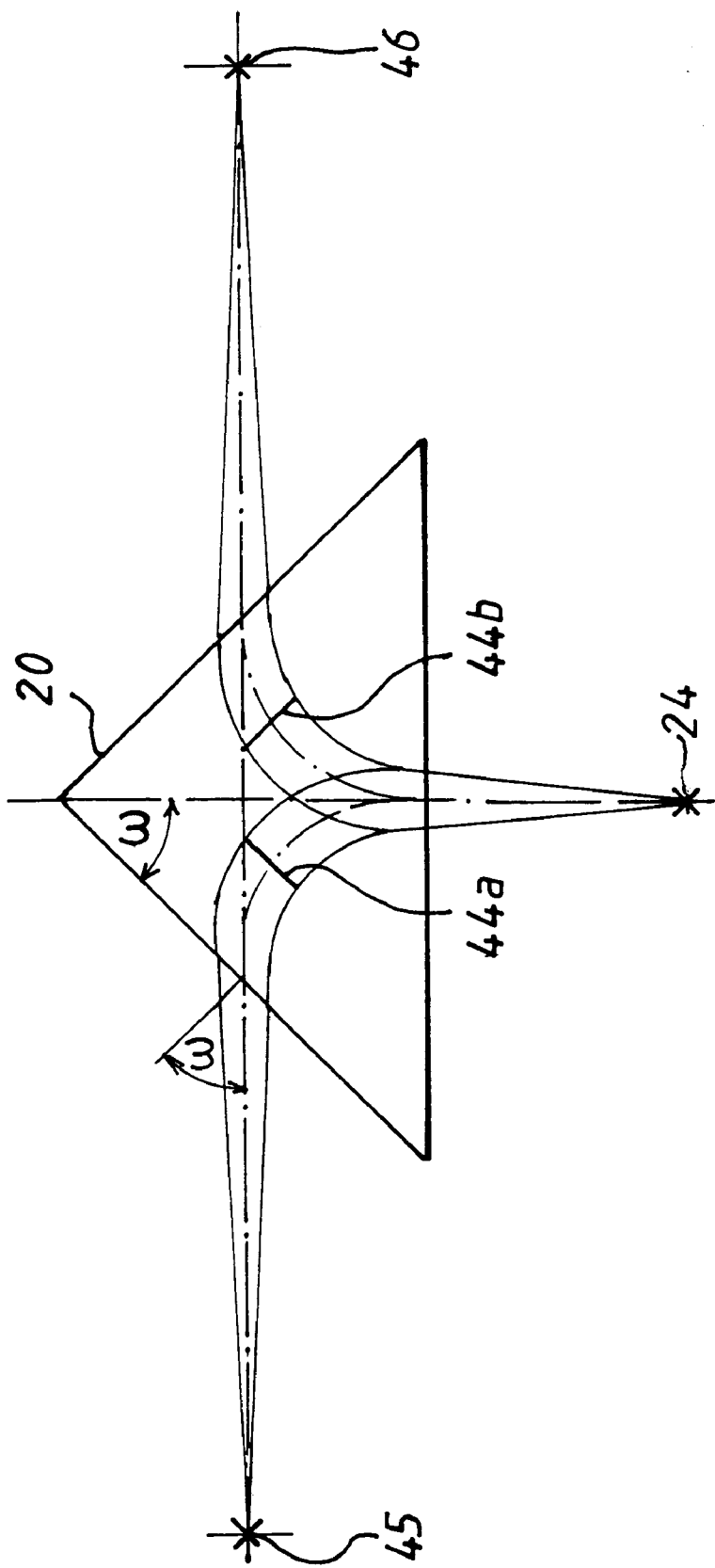

POSITRON SOURCE

BACKGROUND OF THE INVENTION

1. Field of the Invention

The present invention relates to a positron source, and more particularly, to a positron source suitable for use in an electron microscope.

2. Discussion of Relevant Art

A scanning electron microscope is described in European Patent EP-B1 0 205 092, with which investigation of a sample can take place selectively with electrons or with positrons, and the sample can be selectively irradiated with electrons or positrons for this purpose. In an embodiment that is described, the positron beam and the electron beam are superimposed on each other by a deflecting magnet and subsequently conducted along the optical axis of the magnetic lens of the scanning microscope. The radioactive nuclide $^{22}$Na, which is largely e+ active, is used as the positron source. An aluminum foil is positioned in front of the radioactive nuclide in the beam direction; the positrons emitted from the nuclide are braked by it to thermal energy with an energy width of one electron volt. This source has a relatively large spatial extent, and the phase space of the positrons is therefore substantially greater than the phase space of the electrons. Furthermore, the yield of this kind of moderation of the positrons is very low, since only positrons that diffuse through the whole of the aluminum foil emerge again on the other side of the aluminum foil. The intensity of the positron source is very weak because of this low yield, and long measurement times are thus required for measurements of the electron/positron recombination in the sample. In addition, a further weakening of the positron beam takes place within the imaging optics of the electron microscope, in that a large portion of the positrons is absorbed by the tube of the electron microscope in the region of the imaging optics.

SUMMARY OF THE INVENTION

The object of the present invention is to provide a small, intense positron source, with a low energy bandwidth, suitable for use in an electron microscope. This object is achieved by a positron source for the production of an intense positron beam with a small energy band width, having a positron emitter of high specific activity and a reflection moderator arranged in front of the positron emitter in which the reflection moderator has a hole with a diameter of less than 0.4 mm on its emitter side.

The positron source according to the invention contains a positron-emitting nuclide of high specific activity as a positron emitter, and a reflection moderator located in front of the emitter. The reflection moderator is constructed as a thin sheet of a material with a negative work function for positrons, and has a hole with a diameter on the emitter side of less than 0.4 mm., preferably 0.2 mm or 0.1 mm. The positron emitter is thus arranged behind the hole of the reflection moderator. The hole of the reflection moderator is preferably cylindrical or, better still, conical, with a hole diameter that decreases in the direction toward the positron emitter.

By the arrangement of the positron emitter behind the hole of the reflection moderator, a large portion of the emitted positrons strike the moderator material within the hole. The positrons are thermalized in the moderator material and then released with the exit energy from the moderator material. Since the positrons do not have to diffuse through the moderator material, but can remain at the surface of the bore in the region of the bore, the efficiency of the energy conversion in such a reflection moderator is substantially higher than that in a transmission moderator. With a surface diameter of the positron-emitting material of less than 0.4 mm parallel to the cross sectional surface of the hole through the reflection moderator, this positron source has a yield of about $5\times10^{-4}$ after the moderator.

A further advantage of the reflection moderator as against a transmission moderator results from the trimming of the positron-emitting surface, since the positrons emitted by the surface regions of the positron emitter lying laterally outside the hole through the reflection moderator are trapped by the moderator material. Small lateral dimensions of the positron source result thereby; the result is a nearly point source of positrons through the small hole of the reflection moderator, such that the effective surface of the source corresponds to the hole diameter. Altogether, the positron beam emerging from the reflection moderator can be as well imaged and focused by the conventional magnetic lenses in electron microscopes as can the electron beam emitted from a thermionic cathode.

The specific activity of the positron-emitting material should be greater than $10^{10}$ Becquerel (Bq) per gram, preferably greater than $10^{14}$ Bq/gram. A positron source with such a high specific activity can be obtained, for example, by the vapor deposition of a carrier-free, positron-emitting nuclide, for example $^{22}$Na, onto a non-radioactive support. By vapor deposition through a small diaphragm opening, with an aperture diameter of about 0.06–0.3 mm, it is possible for the surface diameter of the positron-emitting region to have a surface diameter of less than 0.4 mm only.

As the material for the reflection moderator, any material with negative work function for positrons is a possibility, for example, tungsten, copper, gold, nickel, aluminum or solid noble gases. Tungsten is preferably used as the moderator material. The negative work function is 2.6 electron volts for tungsten, and the spread of the energy peak is 75 milli-electron volts. Thus the positron beam already has a correspondingly low spread of the energy peak immediately after the moderator.

The hole through the reflection moderator is preferably conical, with a smaller diameter on the side towards the positron emitter than on the side remote from the positron emitter. Due to this conical shape of the hole, an electrostatic extraction field for extracting the positrons can penetrate better into the hole of the reflection moderator, so that the yield of the source is increased.

An adjusting unit is preferably provided, by means of which the support on which the radioactive material is present is adjustable in three mutually perpendicular spatial directions. The positron emitting region can be positioned by means of this adjusting unit directly behind the hole of the moderator, for an optimum yield.

For the use of the positron source in connection with a subsequent imaging optics, a second adjusting unit is preferably provided, by means of which an adjustment in three mutually perpendicular directions is possible for either the reflection moderator or the whole unit of reflection moderator and the adjusting unit for supporting of the radioactive material, relative to the components of the subsequent imaging optics. The positron source can thus be optimally adjusted relative to the beam axis of the imaging optics.

The positron source according to the invention is preferably used in an electron microscope in which the electron beam emitted from an electron source and the positron beam emitted by the positron source are superposed on each other by means of a magnetic prism. Such a magnetic prism can have imaging properties and can then serve to image the positron source and the electron source at the same time in the same crossover plane of the subsequent imaging optics. Such an electron/positron microscope can then be switched over between electron operation and positron operation, in which either the electron beam and/or the positron beam is/are coupled into the imaging beam path.

Preferably a respective further magnetic lens is provided both on the side of the electron source and on the side of the positron source in front of the respective entry into the magnetic prism; the positron beam and the electron beam are thereby focused in the image plane of the magnetic prism.

A further, double reflection system should furthermore be provided directly ahead of the respective source, for the further adjustment of the beam paths, on the positron source side and on the electron source side. For fine tuning between the beam path of the positron beam and that of the electron beam, a further, simple deflection system should be provided directly before the entry of one of the beam paths into the magnetic prism, preferably on the side of the positron source.

Preferably, only the excitation of exclusively iron-free elements in the imaging beam path should be changed when changing over between positron and electron operation. These elements are the air coils that are usually provided for beam adjustment between the electron source and the condensing lens of the imaging optics, or as a stigmator between the condensing lens and the objective lens, or as an electrostatic deflecting unit for scanning a sample in a scanning electron microscope. In a scanning electron microscope with a deflecting system for scanning the sample, however, during positron operation the scanning unit is always set to the same fixed predetermined position, and the object detail of interest is brought into this fixed, predetermined position by means of an adjusting unit of the sample holder.

BRIEF DESCRIPTION OF THE DRAWINGS

The present invention will now be described with reference to specific embodiments, taken together with the drawings, in which:

FIG. 1b shows the beam path within the magnetic prism in a scanning electron microscope according to FIG. 1a;

FIG. 2a shows an enlarged sectional view through the positron source of FIG. 1a;

FIG. 2b shows a further enlarged view of the positron source of FIG. 2a; and

FIG. 3 shows a monitor image for explaining the repositioning on changing over from electron operation to positron operation, in a scanning electron microscope according to FIG. 1a.

DETAILED DESCRIPTION OF PREFERRED EMBODIMENTS

Figure 1A:
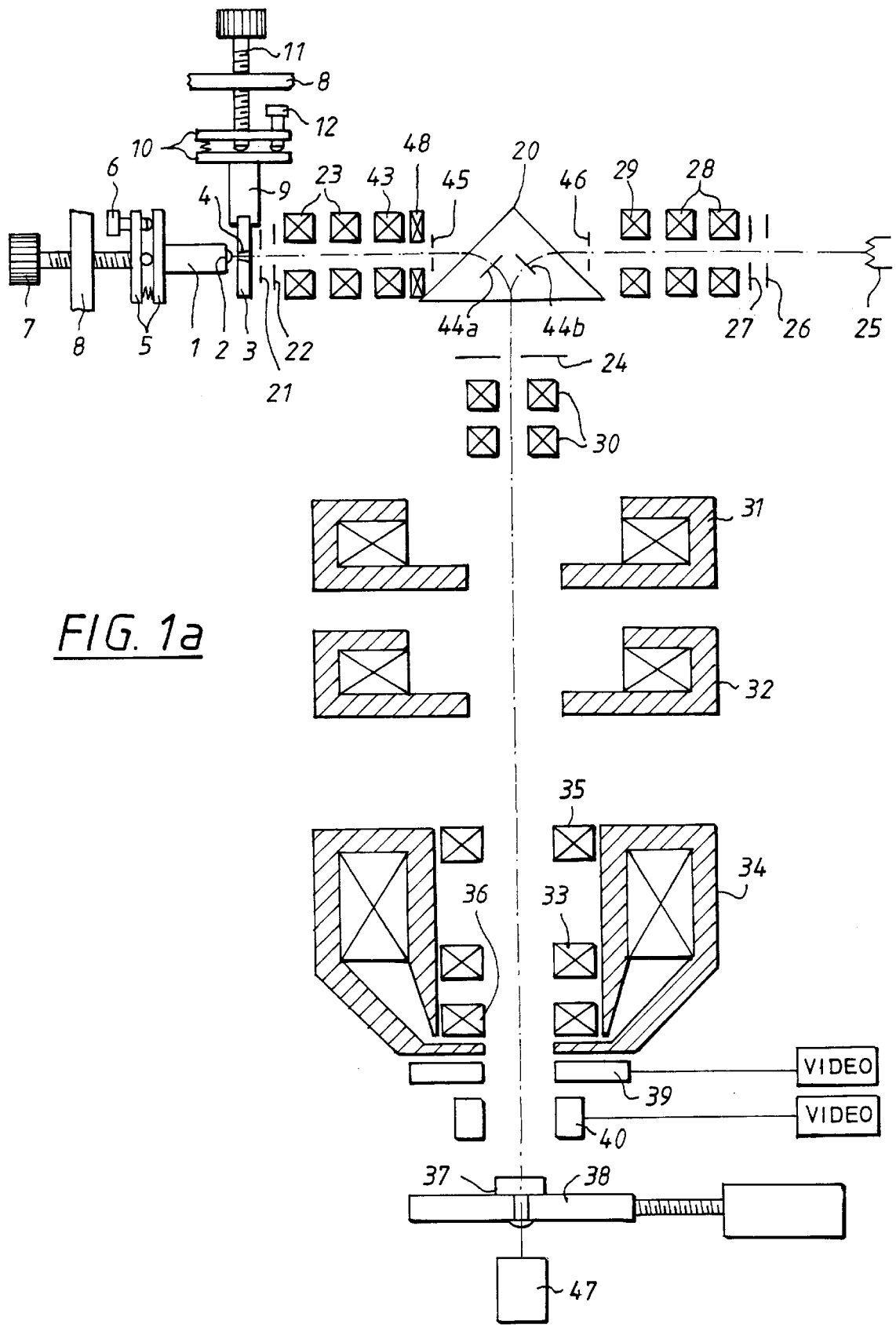
FIG. 1a shows a diagram, in section, of the principles of a scanning electron microscope with a positron source according to the invention.

The construction of the positron source according to the invention will be described with reference to FIGS. 2a and 2b. The positron source consists of a support (1), onto which the radioactive material (2), as a positron emitter, is applied by vapor deposition. The radioactive material (2) is an e+ emitter, for example, $^{22}$Na. Here a carrier-free nuclide of high purity is concerned, with a specific e+ activity of about $10^{14}$ Bq per gram.

The source furthermore comprises a reflection moderator (3), which is constructed from a tungsten sheet with a small, preferably conical, hole (4). The hole (4) has a diameter of less than 0.2 mm, preferably 0.1 mm, on the side facing the radioactive material (2). Holes with such a small diameter can be attained by conventional drilling. The hole (4) can be cylindrical or conical; the conical embodiment is preferred, because an electrostatic extraction field can better penetrate into the hole.

Figure 2A:
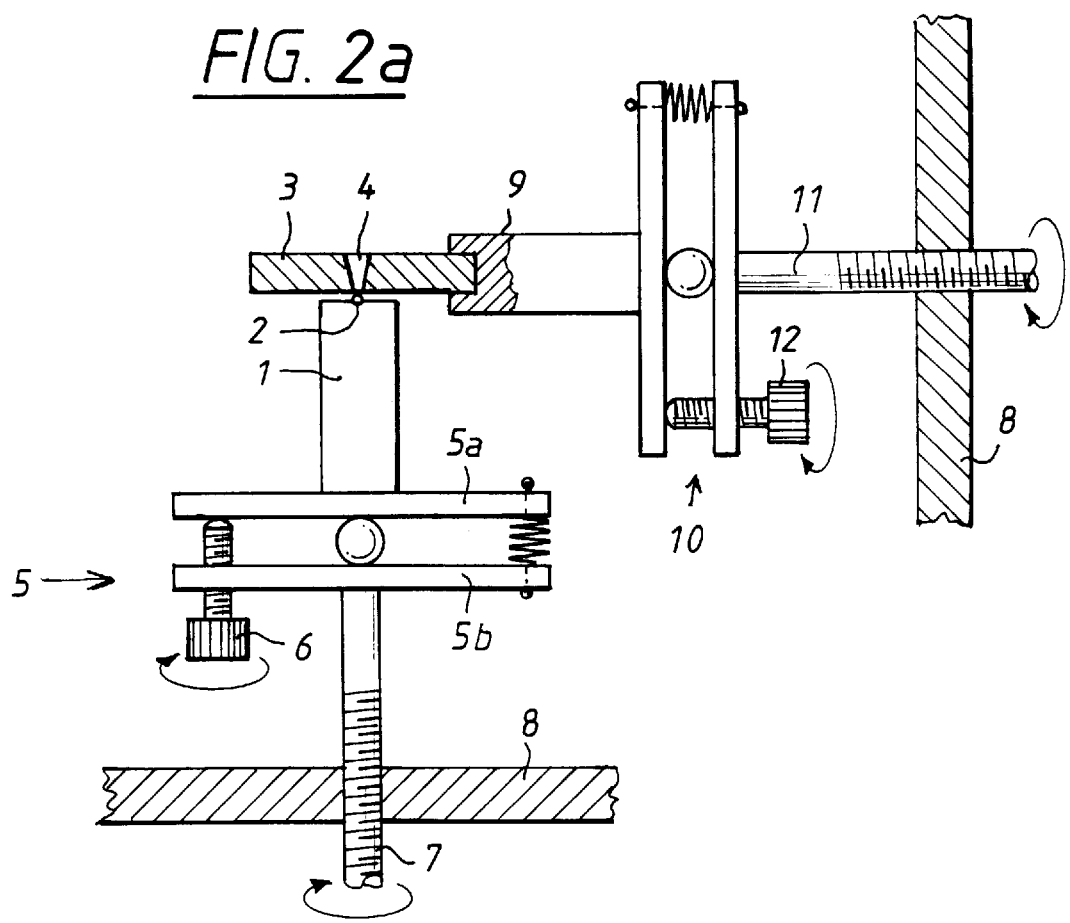
Figure 2B:
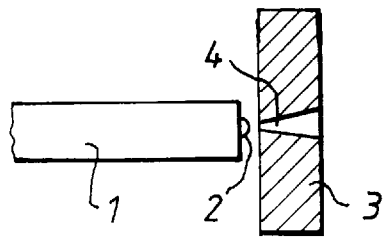

Two adjusting units are provided for fine positioning adjustment of the radioactive material (2) relative to the hole (4) of the moderator (3), as shown in FIG. 2a. The support (1) for the radioactive material (2) is received for this purpose in a mirror mounting (5) that is electrically insulated in a manner not shown in the drawing. The mirror mounting (5) is adjustable, by means of a linear guide (7), relative to a support (8) fixed to the equipment. The linear guide (7) can be simply constructed as a threaded spindle that engages in an internal thread in the frame (8) fixed to the equipment. Rotation of this threaded spindle (7) results in linear displacement of the mirror holder (5) in the axial direction of the threaded spindle. The threaded spindle (7) is furthermore rotatably mounted in the support plate (5b) of the mirror mounting (5). The second plate (5a) of the mirror mounting (5) on which the support (1) with the radioactive material (2) is received is adjustable in two directions, which are perpendicular to the axis of the threaded spindle (7), by means of two adjusting screws, of which only one adjusting screw (6) is shown in FIG. 2a.

In an analogous manner, the moderator (3) is likewise received on the equipment frame (8) and is finely adjustable in three mutually perpendicular spatial directions. The reflection moderator (3) is received for this purpose on a support (9) on a second mirror mounting (10). This second mirror mounting (10) is received by means of a threaded spindle (11). Linear displacement of the mirror mounting (10) parallel to the axis of the second threaded spindle (11) takes place by rotation of the threaded spindle (11).

Adjustment of the reflection moderator (3) in the two spatial directions at right angles to the axis of the threaded spindle (11) takes place by displacing the two adjusting screws of the mirror holder (10), only one (12) of these adjusting screws being shown in FIG. 2a.

The positron source according to the invention is shown in FIG. 1a in combination with a scanning electron microscope. On exiting the moderator (3) of the positron source, the positrons are extracted by means of an extraction electrode (21) that is at a negative potential relative to the moderator, and are accelerated by means of an accelerating electrode (22) to the desired energy. The positron emitter (2) and the reflection moderator (3) are at a positive high voltage. The positron beam is deflected through 90°, and is simultaneously imaged in the entry source plane (24) of the subsequent imaging optics by means of a double deflecting system (23) embodied as air coils, a subsequent condenser lens (43), a further simple deflecting system (48), and a magnetic prism (20). The deflecting system (48) is thus used for fine adjustment of the positron beam, while the double deflecting system (23) is used for the coarse adjustment of the positron beam.

An electron source, in the form of a thermionic cathode (25) with a Wehnelt electrode (26) and an accelerating electrode (27), is furthermore arranged for conventional electron microscopy on the side of the prism (20) opposite to the positron source. Instead of a thermionic cathode (25), a LaB$_6$ cathode, a thermal field emission source, or some other "cold" field emission source can be used. The electron beam emitted from the cathode (25) is likewise imaged in the entry source plane (24) by means of a further double deflection system (28), a further condenser lens (29) arranged after this double deflection system (28), and the magnetic prism (20).

The guiding of both the positron beam and the electron beam in the region of the prism (20) is shown in FIG. 1b. Both the condenser lens (29) on the electron side and the condenser lens (43) on the positron side are excited such that the crossover of the electron source is imaged in one entry source plane (46) and the crossover of the positron source is imaged in the other entry source plane (45), of the magnetic prism (20). The magnetic prism (20) then images both entry source planes (45, 46) in the same exit source plane, with an imaging scale of about 0.5, which coincides with the input source plane (24) of the subsequent electron-optical imaging system. For this case, it is advantageous for the further, simple deflecting system (48) for the adjustment of the positron beam to be provided in the neighborhood of the positron-side entry source plane (45) of the magnetic prism (20).

Alternatively, the electron-side and positron-side condenser lenses (29, 43) can both be excited such that the crossover of the positron source is imaged in the one imaging plane (44a) of the magnetic prism (20), and the crossover of the electron source is imaged in the other imaging plane (44b) of the magnetic prism (20). In this case, the entry source plane (24) of the following imaging system must coincide with the two imaging planes (44a, 44b) of the magnetic prism (20).

In both cases, the magnetic prism has imaging properties, i.e., the magnetic prism images three source planes (45, 46, 24) on each other. A corresponding magnetic prism is known, for example, from the electron microscope EM 902 of the firm of Carl Zeiss, Germany, and therefore needs no detailed description here.

The subsequent imaging optics (FIG. 1a), used equally for positrons and for electrons, has a conventional construction, and contains a double deflecting system (30) for beam adjustment following the entry source plane (24), a two-stage condenser with magnetic lenses (31, 32), stigmator coils (33) arranged on the exit side of the condensers (31, 32), and an objective (34) for focusing the particle beam on a specimen (37) on a specimen holder (38). The condenser lenses (31, 32) and the objective lens (34) are strong magnetic lenses, and consequently have pole pieces of magnetic soft iron. The coils of the double deflecting system (30) used for adjustment and the coil (33) for the stigmator are however constructed as air coils. A further double deflecting system (35, 36) is integrated into the objective (34), and enables the specimen (37) to be scanned in a conventional manner by means of the electron beam.

Two detectors (39, 40) are moreover provided between the double deflection system (35, 36) and the sample holder (38); of these two, one is used for the detection of back-scattered electrons, and the other for the detection of secondary electrons coming from the sample (37). Further detection systems, such as, e.g., X-ray microanalysis systems (EDX, etc.) or cathodoluminescence detectors, can likewise be provided. A gamma detector (47) is also arranged on the optical axis of the electron microscope beneath the sample holder (38), to detect the gamma radiation emitted due to recombination of a positron with an electron of the sample (37), during positron operation.

Because of the positron source according to the invention, with the small emitting spot diameter of less than 0.4 mm and the spread of energy peak of 0.0075 electron volts, the phase space of the emitted positrons about corresponds to the phase space of the electrons of the same energy emitted by the electron source (25). The imaging properties of the scanning electron microscope with the positron source according to the invention are therefore nearly identical for positrons and electrons.

It is furthermore important for the operation of the electron microscope that both the positron beam during positron operation and the electron beam during electron operation are imaged at the same point in the entry source plane (24), before entry into the condenser of the electron microscope. When the electron source is already adjusted, this takes place by adjustment of the moderator (3) and of the radioactive element (2) by means of the two positioning systems of the positron source. Possible erroneous adjustments between the electron beam and the positron beam are thus reduced by a factor of 5 times to 1,000 times in the zoom, according to the setting of the condenser zoom.

On changing over between positron operation and electron operation, only the excitations of the air coils for the beam adjustment (30), the stigmator (33) and the double deflection system (35, 36) are changed. The excitation of the condenser lenses (31, 32) and of the objective (34) however remains unchanged. The change in the excitations of the air coils takes place so that account is taken of the opposite deflecting properties for electrons and positrons in the magnetic lenses.

The course of an investigation with such a combined electron-positron microscope usually takes place such that the specimen (37) is first scanned with the electron beam and the image of the secondary electrons or back-scattered electrons is observed. Thereafter, selected object details are investigated in more detail by means of the positron beam. Independent of the position in which the detail in question of the specimen is located within the electron image, the positron beam is always focused on the same point; that is, the double deflection system (35, 36) is excited in positron operation such that a spatially stationary positron probe in the form of the focused positron beam is obtained. The specimen detail of interest is brought into the focus of the positron beam, instead of aligning the positron beam on the specimen detail of interest.

The size of the region investigated by means of positrons is between 0.1 $\mu$m and 1 $\mu$m, according to the nature of the specimen (37); these different sizes of regions according to the specimen result from the size, dependent on the specimen, of the diffusion region for positrons until they are annihilated by an electron.

Figure 3:
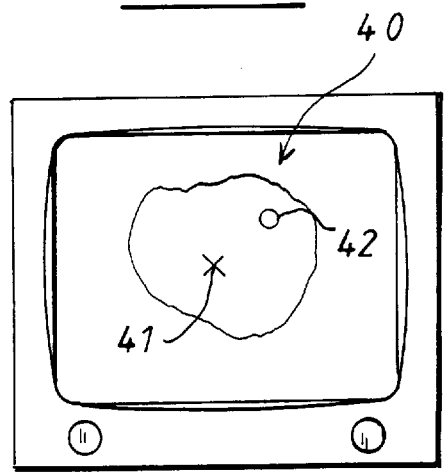

The displacement of the sample can take place either manually or automatically. During manual displacement, the position of the positron probe in the image (40) produced during electron operation is indicated by a marking (41), as shown in FIG. 3. The specimen detail of interest (42) can be brought into the position of the marking (41) by means of the drive of the sample holder, and a changeover can then be made to positron operation. The changeover takes place by the interruption of the electron beam between the emission cathode (25) and the prism (20) by means of a shutter (not shown in the drawing), and the opening of a shutter (not shown in the drawing) between the positron source and the magnetic prism (20). In automatic following of the specimen detail of interest (42), the position of the positron probe relative to the displayed image is stored, and the specimen detail of interest (42) needs only to be marked in the image, for example by means of a cursor. The drive control of the sample holder (38) then causes the sample holder (38) to travel such that the marked specimen detail (42) is brought into the stored position of the positron probe (41).

In the electron-positron microscope described with reference to the Figures, the magnetic prism is embodied as a "three-sided" prism. Instead, other magnetic prisms can be used that at the same time fulfill the condition of beam guiding and focusing, for example, in the form of a four-sided prism that images four source planes into each other. The prism side that is opposite the exit side then remains unused. Moreover, the entry and exit edges of the magnetic prism can also be curved by means of pole pieces with curved edges, in order to reduce imaging errors in the crossover transmission through the magnetic prism.

What is claimed is:

1. A positron source for production of an intense positron beam with a small energy bandwidth, comprising:

a positron emitter of high specific activity, and a reflection moderator arranged in front of said positron emitter, wherein said reflection moderator has a hole with a diameter of less than 0.4 mm on its side directed to said positron emitter, and wherein said hole has a smaller diameter on said positron emitter side than on its side remote from said positron emitter.

2. The positron source according to claim 1, wherein specific activity of said positron emitter is greater than $10^{10}$ Bq/g.

3. The positron source according to claim 1, wherein said reflection moderator (3) comprises a material with a negative work function for positrons.

4. The positron source according to claim 1, wherein said positron emitter (2) has a surface diameter of no more than 0.3 mm.

5. The positron source according to claim 1, in combination with an electron microscope with an electron source (25) and a magnetic prism (20) for superimposing an electron beam coming from said electron source (25) and a positron beam coming from said positron source.

6. The combination according to claim 5, wherein on changing over between positron operation and electron operation, only excitation of iron-free elements (30, 33, 35, 36) in the beam path is changed.

7. The combination according to claim 5, further comprising a deflecting system (35, 36) for scanning a sample (37) with said electron beam, wherein during positron operation, said deflecting system (35, 36) is always set to the same fixed predetermined position.

8. The combination according to claim 5, further comprising imaging optics (31, 32, 34) and at least one double deflecting system (30) for beam adjustment before entry of said positron beam or said electron beam into said imaging optics (31, 32, 34), wherein said double deflecting system (30) is arranged to be differently excited during positron operation and during electron operation.

9. The combination according to claim 5, further comprising a control computer with memory, wherein different sets of data from different excitations are stored in said memory of said control computer.

10. The combination according to claim 5, wherein said magnetic prism (20) has imaging properties and images at least three source planes (45, 46, 24) one within the other.

11. A positron source for production of an intense positron beam with a small energy bandwidth, comprising:

a positron emitter of high specific activity, and a reflection moderator arranged in front of said positron emitter, wherein said reflection moderator has a hole with a diameter of less than 0.4 mm on its side directed to said positron emitter, and wherein said hole through said reflection moderator is conical and has a smaller diameter on said emitter side than on its side remote from said positron emitter.

12. The positron source according to claim 11, wherein specific activity of said positron emitter is greater than $10^{10}$ Bq/g.

13. The positron source according to claim 11, wherein said reflection moderator comprises a material with a negative work function for positrons.

14. The positron source according to claim 11, further comprising a support to which said positron emitter is applied, and a first adjusting unit for positioning said positron emitter in three spatial directions relative to said reflection moderator.

15. The positron source according to claim 14, further comprising a second adjusting unit for positioning said reflection moderator in three mutually perpendicular spatial directions.

16. A positron source for production of an intense positron beam with a small energy bandwidth, comprising:

a positron emitter of high specific activity, a reflection moderator arranged in front of said positron emitter, a support to which said positron emitter is applied, and a first adjusting unit for positioning said positron emitter in three spatial directions relative to said reflection moderator, wherein said reflection moderator has a hole with a diameter of less than 0.4 mm on its side directed to said positron emitter.

17. The positron source according to claim 16, further comprising a second adjusting unit for positioning said reflection moderator in three mutually perpendicular spatial directions.

18. The combination of a positron source for production of an intense positron beam with a small energy bandwidth, comprising:

a positron emitter of high specific activity, a reflection moderator arranged in front of said positron emitter, an electron microscope with an electron source and a magnetic prism for superimposing an electron beam coming from said electron source and a positron beam coming from said positron source, a respective double deflecting system and a respective magnetic lens following said double deflecting system for focusing said positron beam and said electron beam onto an image plane of said magnetic prism, and a further deflecting system positioned in advance of said magnetic prism, in at least one of said positron beam and said electron beam, wherein said reflection moderator has a hole with a diameter of less than 0.4 mm on its side directed to said positron emitter.

19. The combination according to claim 18, further comprising a deflecting system for scanning a sample with said electron beam, wherein during positron operation said deflecting system is always set to a same fixed predetermined position.

20. The combination according to claim 18, further comprising imaging optics and at least one double deflecting system for beam adjustment before entry of said positron beam or said electron beam into said imaging optics, wherein said double deflecting system is arranged to be differently excited during positron operation and during electron operation.

21. The combination according to claim 18, further comprising a control computer with memory, wherein different sets of data from different excitations are stored in said memory of said control computer.

22. The combination according to claim 18, wherein said magnetic prism has imaging properties and images at least three source planes one within the other.

* * * * *